(12) United States Patent
Tokunaga et al.

(10) Patent No.: US 12,147,158 B2
(45) Date of Patent: *Nov. 19, 2024

(54) PHOTOCURABLE COMPOSITION AND METHOD FOR PRODUCING SEMICONDUCTOR DEVICE

(71) Applicant: NISSAN CHEMICAL CORPORATION, Tokyo (JP)

(72) Inventors: Hikaru Tokunaga, Toyama (JP); Takafumi Endo, Toyama (JP); Keisuke Hashimoto, Toyama (JP); Rikimaru Sakamoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 1 day.

This patent is subject to a terminal disclaimer.

(21) Appl. No.: 18/128,503

(22) Filed: Mar. 30, 2023

(65) Prior Publication Data
US 2023/0244141 A1 Aug. 3, 2023

Related U.S. Application Data

(63) Continuation of application No. 16/324,483, filed as application No. PCT/JP2017/027727 on Jul. 31, 2017, now Pat. No. 11,681,223.

(30) Foreign Application Priority Data

Aug. 8, 2016 (JP) .................... 2016-155472
Mar. 1, 2017 (JP) .................... 2017-038276

(51) Int. Cl.
| | | |
|---|---|---|
| *G03F 7/11* | (2006.01) |
| *C08G 59/14* | (2006.01) |
| *C08G 59/68* | (2006.01) |
| *C08L 63/00* | (2006.01) |
| *G03F 7/004* | (2006.01) |
| *G03F 7/008* | (2006.01) |
| *G03F 7/027* | (2006.01) |
| *G03F 7/038* | (2006.01) |
| *G03F 7/09* | (2006.01) |
| *G03F 7/40* | (2006.01) |
| *H01L 21/027* | (2006.01) |

(52) U.S. Cl.
CPC ............ *G03F 7/008* (2013.01); *C08G 59/14* (2013.01); *C08G 59/1477* (2013.01); *C08G 59/1483* (2013.01); *C08G 59/68* (2013.01); *G03F 7/0045* (2013.01); *G03F 7/0275* (2013.01); *G03F 7/038* (2013.01); *G03F 7/094* (2013.01); *G03F 7/11* (2013.01); *G03F 7/40* (2013.01); *C08L 63/00* (2013.01); *H01L 21/0274* (2013.01)

(58) Field of Classification Search
CPC ............. C08G 59/14; C08G 59/1477; C08G 59/1483; G03F 7/094
USPC .................................................... 430/271.1
See application file for complete search history.

(56) References Cited

U.S. PATENT DOCUMENTS

| | | | |
|---|---|---|---|
| 3,852,256 A * | 12/1974 | Parker ..................... G03F 7/012 |
| | | | 522/39 |
| 4,442,196 A | 4/1984 | Iwaki et al. | |
| 11,681,223 B2 * | 6/2023 | Tokunaga ............. G03F 7/0045 |
| | | | 430/196 |
| 2009/0130594 A1 | 5/2009 | Takei et al. | |
| 2009/0162782 A1 | 6/2009 | Takei et al. | |
| 2010/0022092 A1 | 1/2010 | Horiguchi et al. | |
| 2017/0075223 A1 | 3/2017 | Steenackers et al. | |
| 2019/0079397 A1 * | 3/2019 | Endo ....................... G03F 7/094 |

FOREIGN PATENT DOCUMENTS

| | | | |
|---|---|---|---|
| EP | 2916171 A1 | 9/2015 |
| JP | S54-135525 A | 10/1979 |
| JP | S63-271334 A | 11/1988 |
| JP | 2004-533637 A | 11/2004 |
| JP | 2009-139763 A | 6/2009 |
| JP | 2010-079081 A | 4/2010 |
| JP | 2012-198470 A | 10/2012 |
| JP | 2013213076 A * | 10/2013 |
| JP | 2014-129526 A | 7/2014 |
| JP | 2015-501874 A | 1/2015 |
| KR | 2005-0047088 A | 5/2005 |
| KR | 2011-0086812 A | 8/2011 |
| WO | 2006/115044 A1 | 11/2006 |
| WO | 2007/066597 A1 | 6/2007 |
| WO | 2008/047638 A1 | 4/2008 |
| WO | 2009/008446 A1 | 1/2009 |

OTHER PUBLICATIONS

English Machine Translation of JP2013213076A (Year: 2013).*
Rein et al. "An Explosophore-Based Approach Towards the Prediction of Energetic Material Sensitivity Properties", Aug. 10, 2021, ChemRxiv.org, DOI:10.33774/chemrxiv-2021-16f6w-v2 (Year: 2021).*
Oct. 24, 2017 International Search Report issued in International Patent Application No. PCT/JP2017/027727.

(Continued)

*Primary Examiner* — Mark F. Huff
*Assistant Examiner* — Nicholas E Brown
(74) *Attorney, Agent, or Firm* — Oliff PLC

(57) ABSTRACT

A photocurable composition for forming coating film having flattening properties on a substrate, with high fillability into patterns and capability of forming a coating film that is free from thermal shrinkage, which contains at least one compound that contains a photodegradable nitrogen-containing and/or photodegradable sulfur-containing structure, a hydrocarbon structure, and a solvent. The compound may have the photodegradable nitrogen-containing and/or photodegradable sulfur-containing structure and the hydrocarbon structure in one molecule, or may be a combination of compounds which contain the structures in separate molecules.

12 Claims, No Drawings

(56) References Cited

OTHER PUBLICATIONS

Oct. 24, 2017 Written Opinion of the International Searching Authority issued in International Patent Application No. PCT/JP2017/027727.
English Translation of JP 2009-139763 A generated on ip.com on Aug. 3, 2020, 10 pages (Year: 2020).
English Translation of JP 2009-079081 A generated on ip.com on Aug. 3, 2020, 28 pages (Year: 2020).
English Translation of JP 2009-198470 A generated on ip.com on Aug. 3, 2020, 24 pages (Year: 2020).
Martin et al"Use of the bis-azide-crosslinking moieties described in WO 04/100,282 or WO 2011/068482 as crosslinkers for insulating materials" IP.com No. IPCOM000230168D ,IP.com Electronic Publication Date: Aug. 26, 2013, nine pages (Year: 2013).

* cited by examiner

PHOTOCURABLE COMPOSITION AND METHOD FOR PRODUCING SEMICONDUCTOR DEVICE

The present application is a continuation application of U.S. application Ser. No. 16/324,483 filed Feb. 8, 2019, the entire disclosure of which is incorporated herein by reference.

TECHNICAL FIELD

The present invention relates to a photocurable composition using a photocrosslinkable compound, and a method for producing a semiconductor device using the composition.

BACKGROUND ART

In recent years, a semiconductor integrated circuit device has been processed in accordance with a fine design rule. In formation of a finer resist pattern by an optical lithography technique, it is necessary to decrease the wavelength of exposure light.

However, the depth of focus is decreased with the decrease in wavelength of exposure light. Therefore, it is necessary to improve properties of flattening a coating film formed on a substrate. In production of a semiconductor device in accordance with the finer design rule, a technique for flattening a substrate is required.

A method for forming a flattened film, for example, a resist underlayer film, which is formed under a resist, by photocuring has been disclosed.

A resist underlayer film-forming composition containing a polymer having epoxy group and oxetane group in a side chain and a photo-cationic polymerization initiator or a resist underlayer film-forming composition containing a polymer having a radical polymerizable ethylenically unsaturated bond and a photo-radical polymerization initiator has been disclosed (see Patent Document 1).

A resist underlayer film-forming composition containing a silicon-containing compound having a cationic polymerizable reactive group such as epoxy group and vinyl group, a photo-cationic polymerization initiator, and a photo-radical polymerization initiator has been disclosed (see Patent Document 2).

A method for producing a semiconductor device using a resist underlayer film containing a polymer having a crosslinkable functional group (e.g., hydroxyl group) in a side chain, a crosslinker, and a photoacid generator has been disclosed (see Patent Document 3).

A resist underlayer film having an unsaturated bond in a main chain or side chain, which is not a photo-crosslinkable resist underlayer film, has been disclosed (see Patent Documents 4 and 5).

PRIOR ART DOCUMENTS

Patent Documents

Patent Document 1: International Publication No. 2006/115044 (WO 2006/115044)
Patent Document 2: International Publication No. 2007/066597 (WO 2007/066597)
Patent Document 3: International Publication No. 2008/047638 (WO 2008/047638)
Patent Document 4: International Publication No. 2009/008446 (WO 2009/008446)
Patent Document 5: Japanese Patent Application Publication No. 2004-533637 (JP 2004-533637 A)

SUMMARY OF THE INVENTION

Problem to be Solved by the Invention

When a conventional photo-crosslinking material, for example, a resist underlayer film-forming composition containing a polymer having a thermal crosslinking-forming functional group such as hydroxyl group, a crosslinker, and an acid catalyst (acid generator) is heated to fill a pattern (e.g., a hole or trench structure) formed on a substrate, a crosslinking reaction proceeds, and the viscosity increases. Therefore, it is difficult that the pattern is filled.

An object of the present invention is to provide a photocurable composition that does not promote a crosslinking reaction until the composition is irradiated with light to produce a crosslinking group due to photodegradation, does not increase the viscosity, and is capable of stably filling a pattern of a substrate and coating the substrate.

Means for Solving the Problems

A first aspect of the present invention is a photocurable composition comprising at least one compound having a photodegradable nitrogen-containing structure and/or photodegradable sulfur-containing structure, and a hydrocarbon structure, and a solvent.

A second aspect of the present invention is the photocurable composition according to the first aspect, wherein the compound is a compound having one or more photodegradable nitrogen-containing structures and/or photodegradable sulfur-containing structures in one molecule.

A third aspect of the present invention is the photocurable composition according to the first aspect, wherein the compound is a compound having the photodegradable nitrogen-containing structure and/or photodegradable sulfur-containing structure, and the hydrocarbon structure in one molecule, or a combination of compounds having the photodegradable nitrogen-containing structure and/or photodegradable sulfur-containing structure, and the hydrocarbon structure in separate molecules.

A fourth aspect of the present invention is the photocurable composition according to any one of the first to third aspects, wherein the hydrocarbon structure is a saturated or unsaturated, linear, branched, or cyclic hydrocarbon group having a carbon atom number of 1 to 40.

A fifth aspect of the present invention is the photocurable composition according to any one of the first to fourth aspects, wherein the photodegradable nitrogen-containing structure is a structure producing a reactive nitrogen-containing functional group or a reactive carbon-containing functional group by irradiation with ultraviolet light, or a structure having a reactive nitrogen-containing functional group or a reactive carbon-containing functional group produced by irradiation with ultraviolet light.

A sixth aspect of the present invention is the photocurable composition according to the fifth aspect, wherein the photodegradable nitrogen-containing structure is a photodegradable nitrogen-containing structure optionally having a sulfur atom, the structure including an azide structure, a tetrazole structure, a triazole structure, an imidazole structure, a pyrazole structure, an azole structure, a diazo structure, or a combination of the structures.

A seventh aspect of the present invention is the photocurable composition according to any one of the first to fourth aspects, wherein the photodegradable sulfur-containing structure is a structure producing an organic sulfur radical or a carbon radical by irradiation with ultraviolet light, or a structure having an organic sulfur radical or a carbon radical produced by irradiation with ultraviolet light.

An eighth aspect of the present invention is the photocurable composition according to the seventh aspect, wherein the photodegradable sulfur-containing structure is a photodegradable sulfur-containing structure optionally having a nitrogen atom, the structure including a trisulfide structure, a disulfide structure, a sulfide structure, a thioketone structure, a thiophene structure, a thiol structure, or a combination of the structures.

A ninth aspect of the present invention is the photocurable composition according to any one of the first to eighth aspects, wherein the compound is a product obtained by an addition reaction of a carboxylic acid (carboxyl group)-containing compound, a hydroxyl group-containing compound, an amine (amino group)-containing compound, or a thiol group-containing compound with an epoxy compound, the photodegradable nitrogen-containing structure and/or photodegradable sulfur-containing structure is included in one substrate and the hydrocarbon structure is included in another substrate, or the photodegradable nitrogen-containing structure and/or photodegradable sulfur-containing structure and the hydrocarbon structure are included only in one substrate and another substrate includes these structures or does not include these structures.

A tenth aspect of the present invention is the photocurable composition according to any one of the first to ninth aspects, wherein a content of the compound is 30 to 100% by mass relative to the mass of solid content of the photocurable composition except for the solvent.

An eleventh aspect of the present invention is the photocurable composition according to any one of the first to tenth aspects which is a photocurable resist underlayer film-forming composition used in a lithography process in production of a semiconductor device.

A twelfth aspect of the present invention is the photocurable composition according to any one of the first to eleventh aspects which is a photocurable stepped substrate-coating composition used in a lithography process in production of a semiconductor device.

A thirteenth aspect of the present invention is a method for producing a coated substrate comprising steps of: (i) applying the photocurable composition according to any one of the first to twelfth aspects to a substrate; and (ii) exposing the applied photocurable composition to light.

A fourteenth aspect of the present invention is the method according to the thirteenth aspect comprising, after the step (i), a step (ia) of heating the applied photocurable composition at 70 to 400° C. for 10 seconds to 5 minutes.

A fifteenth aspect of the present invention is the method according to the thirteenth or fourteenth aspect, wherein the exposure light in the step (ii) has a wavelength of 150 nm to 248 nm.

A sixteenth aspect of the present invention is the method according to any one of the thirteenth to fifteenth aspect, wherein the exposure does of the exposure light in the step (ii) is 10 mJ/cm$^2$ to 3,000 mJ/cm$^2$.

A seventeenth aspect of the present invention is a method for producing a semiconductor device comprising steps of: applying the photocurable composition according to any one of the first to twelfth aspects to a semiconductor substrate, followed by exposure to light, to form an underlayer film; forming a resist film on the underlayer film; irradiating the resist film with light or an electron beam, followed by development, to form a resist pattern; etching the underlayer film through the resist pattern; and processing the semiconductor substrate through the patterned underlayer film.

An eighteenth aspect of the present invention is a method for producing a semiconductor device comprising steps of: applying the photocurable composition according to any one of the first to twelfth aspects to a semiconductor substrate, followed by exposure to light, to form an underlayer film; forming a hard mask on the underlayer film; forming a resist film on the hard mask; irradiating the resist film with light or an electron beam, followed by development, to form a resist pattern; etching the hard mask through the resist pattern; etching the underlayer film through the patterned hard mask; and processing the semiconductor substrate through the patterned underlayer film.

A nineteenth aspect of the present invention is the method according to any one of the thirteenth to eighteenth aspects, wherein the semiconductor substrate has an open area (unpatterned area) and a patterned area of dense (DENCE) and crude (ISO) patterns, and an aspect ratio of the patterns is 0.1 to 10.

Effects of the Invention

The present invention is a photocurable composition including a compound having at least one photodegradable nitrogen-containing structure and/or photodegradable sulfur-containing structure, and a hydrocarbon structure.

The photodegradable nitrogen-containing structure is irradiated with light to generate a nitrogen gas. As a result, a structure having a reactive nitrogen-containing functional group (nitrene group) or a reactive carbon-containing functional group (carbene group) is produced. At that time, due to generation of a nitrogen gas by irradiation of the photodegradable nitrogen-containing structure with light, a structure including a reactive nitrogen-containing functional group (nitrene group) or a reactive carbon-containing functional group (carbene group) may be produced. The reactive nitrogen-containing functional group is also referred to as nitrene group. For example, the reactive nitrogen-containing functional group is reacted with an alkene or a benzene ring to form an aziridine ring or the like, and as a result, crosslinking proceeds. The nitrene group causes an insertion reaction into a C—H bond or a C—C bond, to form a crosslinking structure. Further, the nitrene group reacts with another nitrene group to produce an azo compound, and as a result, formation of a crosslinking structure proceeds. Moreover, a hydrogen atom is abstracted from a hydrocarbon group by the nitrene group, and as a result, formation of a radically reactive crosslinking structure also proceeds. By a concerted reaction for formation of various crosslinking structures due to the reactive nitrogen-containing functional group or the reactive carbon-containing functional group, which is produced by irradiation of the photodegradable nitrogen-containing structure with light, a photocured product is produced.

The photodegradable sulfur-containing structure is irradiated with light to produce a structure having an organic sulfur radical (thiyl radical) or a carbon radical, which is produced by cleavage. A hydrogen atom is abstracted from a hydrocarbon group by the radical, and as a result, formation of a radically reactive crosslinking structure proceeds. Further, the radical is subjected to a coupling reaction to promote formation of a crosslinking structure. By a concerted reaction for formation of various crosslinking structures due to a structure having the organic sulfur radical or the carbon radical, which is produced by irradiation of the photodegradable sulfur-containing structure with light, a photocured product is produced.

The photocurable composition of the present invention can be used as a stepped substrate-coating composition. In the present invention, the stepped substrate-coating composition is applied to a substrate, and if necessary, heated to reflow, and as a result, a pattern is filled with the composition. In this case, the viscosity of the stepped substrate-coating composition is not increased due to the absence of a thermal crosslinking moiety and an acid catalyst, and a flat film is formed regardless of an open area (unpatterned area) and a patterned area of dense (DENCE) and coarse (ISO) patterns on the substrate. Thus, both the pattern filling properties and the flattening properties after filling are satisfied. An excellent flattened film can be formed.

Therefore, the present invention can provide a photocurable composition capable of stably filling a pattern of a substrate and coating the substrate.

MODES FOR CARRYING OUT THE INVENTION

The present invention is a photocurable composition comprising a compound having at least one photodegradable nitrogen-containing structure and/or photodegradable sulfur-containing structure, and a hydrocarbon structure, and a solvent.

The solid content of the composition is 0.1 to 70% by mass, 0.1 to 60% by mass, 0.2 to 30% by mass, or 0.3 to 15% by mass. The solid content is the content of all components of the photocurable composition except for the solvent. In the solid content, the compound may be contained in an amount of 30 to 100% by mass, 50 to 100% by mass, 70 to 100% by mass, or 70 to 99% by mass.

The compound used in the present invention has an average molecular weight of 200 to 1,000,000, 300 to 1,000,000, 600 to 1,000,000, 600 to 200,000, or 1,500 to 15,000.

The compound may be a compound having one or more or two or more photodegradable nitrogen-containing structures and/or photodegradable sulfur-containing structures in one molecule. The compound may have two or more photodegradable nitrogen-containing structures and/or photodegradable sulfur-containing structures in one molecule. When the intensity of irradiated light is high, photocuring can be achieved due to one or more photodegradable nitrogen-containing structures and/or photodegradable sulfur-containing structures in the molecule.

The compound is considered to be a compound having the photodegradable nitrogen-containing structure and/or photodegradable sulfur-containing structure, and the hydrocarbon structure in the molecule, or a combination of compounds having the photodegradable nitrogen-containing structure and/or photodegradable sulfur-containing structure, and the hydrocarbon structure in separate molecules.

The photodegradable nitrogen-containing structure may be a structure producing a reactive nitrogen-containing functional group or a reactive carbon-containing functional group by irradiation with ultraviolet light, or a structure having a reactive nitrogen-containing functional group or a reactive carbon-containing functional group produced by irradiation with ultraviolet light. The photodegradable nitrogen-containing structure may be a structure having a reactive nitrogen-containing functional group or a reactive carbon-containing functional group produced with a gas for denitrogenation by irradiation with ultraviolet light.

The photodegradable nitrogen-containing structure is a photodegradable nitrogen-containing structure that may have a sulfur atom. Examples of the structure include an azide structure, a tetrazole structure, a triazole structure, an imidazole structure, a pyrazole structure, an azole structure, a diazo structure, and a combination of the structures. The photodegradable nitrogen-containing structure may be the aforementioned structure or may have a sulfur atom at an adjacent moiety. The sulfur atom may be a sulfur atom as a heteroatom or a sulfur atom included in the photodegradable sulfur-containing structure. For example, the photodegradable nitrogen-containing structure may be a structure in which a part of carbon atoms in the aforementioned structure or adjacent to the structure is substituted with a sulfur atom. The sulfur atom may be a sulfur atom included, as a part of the photodegradable sulfur-containing structure, in the structure or in a moiety adjacent to the structure.

The photodegradable sulfur-containing structure is a structure producing an organic sulfur radical or a carbon radical by irradiation with ultraviolet light, or a structure having an organic sulfur radical or a carbon radical produced by irradiation with ultraviolet light.

The photodegradable sulfur-containing structure is a photodegradable sulfur-containing structure that may have a nitrogen atom. Examples of the structure include a trisulfide structure, a disulfide structure, a sulfide structure, a thioketone structure, a thiophene structure, a thiol structure, or a combination of the structures. The photodegradable sulfur-containing structure may be the aforementioned structure or may have a nitrogen atom at an adjacent moiety. The nitrogen atom may be a nitrogen atom as a heteroatom or photodegradable nitrogen-containing structure. For example, the photodegradable sulfur-containing structure may be a structure in which a part of carbon atoms in the aforementioned structure or adjacent to the structure is substituted with a nitrogen atom. The nitrogen atom may be a nitrogen atom included, as a part of the photodegradable nitrogen-containing structure, in the structure or in a moiety adjacent to the structure.

The hydrocarbon structure in the compound used in the present invention may be a saturated or unsaturated, linear, branched, or cyclic hydrocarbon group having a carbon atom number of 1 to 40. The hydrocarbon group may be a substituted or unsubstituted hydrocarbon group. The hydrocarbon group may be introduced into a terminal, side chain, or main chain of the compound.

Examples of the hydrocarbon group include chemical groups corresponding to an alkyl group, an alkenyl group, and an aryl group. The alkyl group, alkenyl group, and aryl group may include an amido group, an epoxy group, an ether group, an ester group, a hydroxyl group, an amino group, and a thiol group.

Examples of $C_{1-40}$ alkyl group include $C_{1-10}$ alkyl groups such as methyl group, ethyl group, n-propyl group, i-propyl group, cyclopropyl group, n-butyl group, i-butyl group, s-butyl group, t-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Examples of the $C_{2-40}$ alkenyl group include ethenyl group, 1-propenyl group, 2-propenyl group, 1-methyl-1-ethenyl group, 1-butenyl group, 2-butenyl group, 3-butenyl group, 2-methyl-1-propenyl group, 2-methyl-2-propenyl group, 1-ethylethenyl group, 1-methyl-1-propenyl group, 1-methyl-2-propenyl group, 1-pentenyl group, 2-pentenyl group, 3-pentenyl group, 4-pentenyl group, 1-n-propylethenyl group, 1-methyl-1-butenyl group, 1-methyl-2-butenyl group, 1-methyl-3-butenyl group, 2-ethyl-2-propenyl group, 2-methyl-1-butenyl group, 2-methyl-2-butenyl group, 2-methyl-3-butenyl group, 3-methyl-1-butenyl group, 3-methyl-2-butenyl group, 3-methyl-3-butenyl group, 1,1-dimethyl-2-propenyl group, 1-i-propylethenyl group, 1,2-dimethyl-1-propenyl group, 1,2-dimethyl-2-propenyl group, 1-cyclopentenyl group, 2-cyclopentenyl group, 3-cyclopentenyl group, 1-hexenyl group, 2-hexenyl group, 3-hexenyl group, 4-hexenyl group, 5-hexenyl group, 1-methyl-1-pentenyl group, 1-methyl-2-pentenyl group, 1-methyl-3-pentenyl group, 1-methyl-4-pentenyl group, 1-n-butylethenyl group, 2-methyl-1-pentenyl group, 2-methyl-2-pentenyl group, 2-methyl-3-pentenyl group, 2-methyl-4-pentenyl group, 2-n-propyl-2-propenyl group, 3-methyl-1-pentenyl group, 3-methyl-2-pentenyl group, 3-methyl-3-pentenyl group, 3-methyl-4-pentenyl group, 3-ethyl-3-butenyl group, 4-methyl-1-pentenyl group, 4-methyl-2-pentenyl group, 4-methyl-3-pentenyl group, 4-methyl-4-pentenyl group, 1,1-dimethyl-2-butenyl group, 1,1-dimethyl-3-butenyl group, 1,2-dimethyl-1-butenyl group, 1,2-dimethyl-2-butenyl group, 1,2-dimethyl-3-butenyl group, 1-methyl-2-ethyl-2-propenyl group, 1-s-butylethenyl group, 1,3-dimethyl-1-butenyl group, 1,3-dimethyl-2-butenyl group, 1,3-dimethyl-3-butenyl group, 1-i-butylethenyl group, 2,2-dimethyl-3-butenyl group, 2,3-dimethyl-1-butenyl group, 2,3-dimethyl-2-butenyl group, 2,3-dimethyl-3-butenyl group, 2-i-propyl-2-propenyl group, 3,3-dimethyl-1-butenyl group, 1-ethyl-1-butenyl group, 1-ethyl-2-butenyl group, 1-ethyl-3-butenyl group, 1-n-propyl-1-propenyl group, 1-n-propyl-2-propenyl group, 2-ethyl-1-butenyl group, 2-ethyl-2-butenyl group, 2-ethyl-3-butenyl group, 1,1,2-trimethyl-2-propenyl group, 1-t-butylethenyl group, 1-methyl-1-ethyl-2-propenyl group, 1-ethyl-2-methyl-1-propenyl group, 1-ethyl-2-methyl-2-propenyl group, 1-i-propyl-1-propenyl group, 1-i-propyl-2-propenyl group, 1-methyl-2-cyclopentenyl group, 1-methyl-3-cyclopentenyl group, 2-methyl-1-cyclopentenyl group, 2-methyl-2-cyclopentenyl group, 2-methyl-3-cyclopentenyl group, 2-methyl-4-cyclopentenyl group, 2-methyl-5-cyclopentenyl group, 2-methylene-cyclopentyl group, 3-methyl-1-cyclopentenyl group, 3-methyl-2-cyclopentenyl group, 3-methyl-3-cyclopentenyl group, 3-methyl-4-cyclopentenyl group, 3-methyl-5-cyclopentenyl group, 3-methylene-cyclopentyl group, 1-cyclohexenyl group, 2-cyclohexenyl group, and 3-cyclohexenyl group.

Examples of the $C_{6-40}$ aryl group include $C_{6-40}$ aryl groups such as phenyl group, biphenyl group, terphenylene group, fluorene group, naphthyl group, anthryl group, pyrene group, and carbazole group.

The compound may be a product obtained by an addition reaction of a carboxylic acid (carboxyl group)-containing compound, a hydroxyl group-containing compound, an amine (amino group)-containing compound, or a thiol group-containing compound with an epoxy compound. In this case, the photodegradable nitrogen-containing structure and/or photodegradable sulfur-containing structure is included in one substrate and the hydrocarbon structure is included in another substrate, or the photodegradable nitrogen-containing structure and/or photodegradable sulfur-containing structure and the hydrocarbon structure are included only in one substrate and another substrate includes these structures or does not include these structures.

Examples of the carboxylic acid-containing compound, hydroxyl group-containing compound, amine-containing compound, and thiol-containing compound include 4-azidebenzoic acid, 4-azidephenol, 1H-tetrazole-1-acetic acid, 1H-tetrazole-1-methanol, triazoleacetic acid, triazolemethanol, DL-α-lipoic acid, xanthane hydride, 1,3,4-thiadiazol-2-thiol, and trimethylthiourea.

The compounds also include examples of the following chemical formulae.

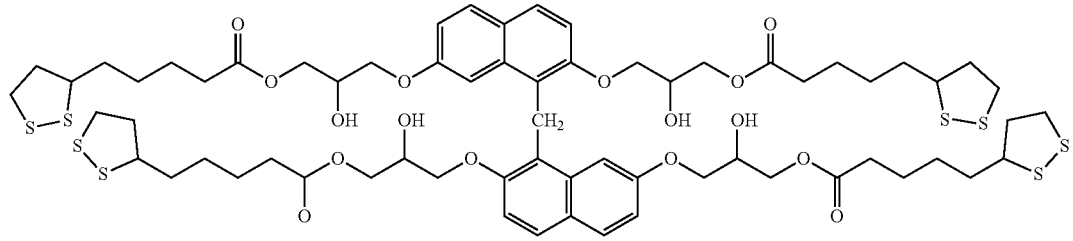

Formula (1-1)

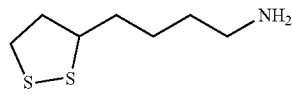

Formula (A-7)

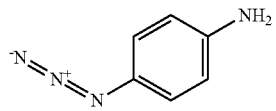

Formula (A-8)

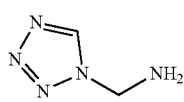
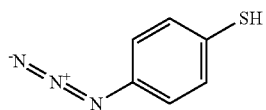
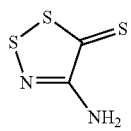
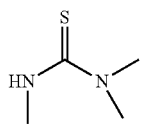

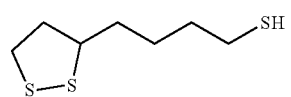
Formula (A-9)  Formula (A-10)

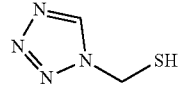
Formula (A-11)  Formula (A-12)

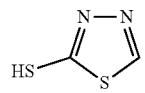
Formula (A-13)  Formula (A-14)

Formula (A-15)

Examples of the epoxy compound include compounds such as benzene and naphthalene having an epoxy group or glycidyl group. The epoxy compound can be obtained by a reaction of phenol or naphthol with epichlorohydrin. An aliphatic epoxy compound may also be used. For example, the epoxy compound includes epoxy compounds of the following formulae.

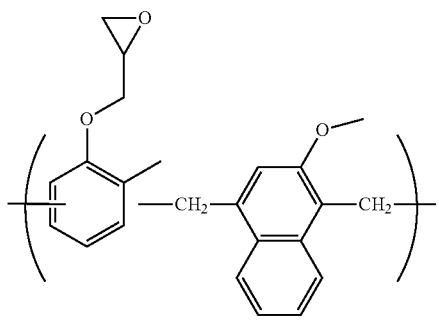
Formula (B-1)

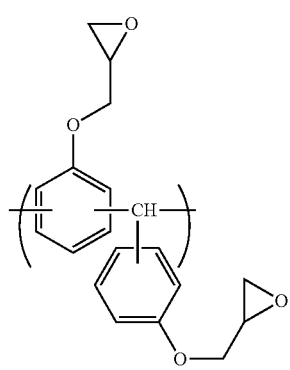
Formula (B-4)

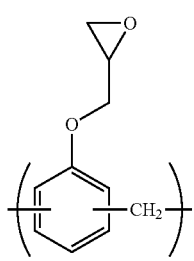
Formula (B-2)

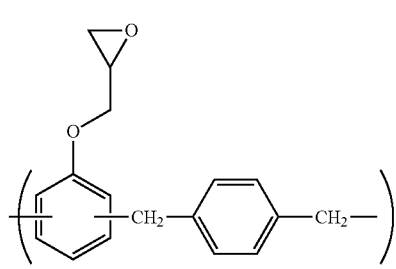
Formula (B-5)

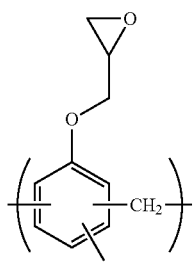
Formula (B-3)

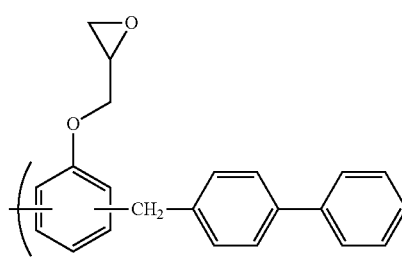
Formula (B-6)

-continued
Formula (B-7)
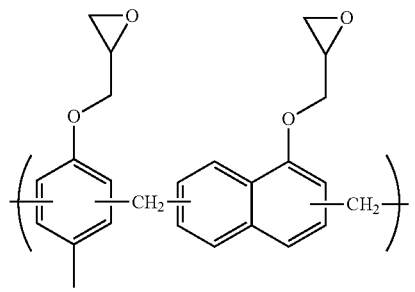
Formula (B-8)
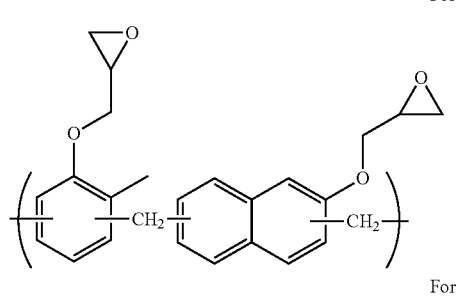
Formula (B-9)
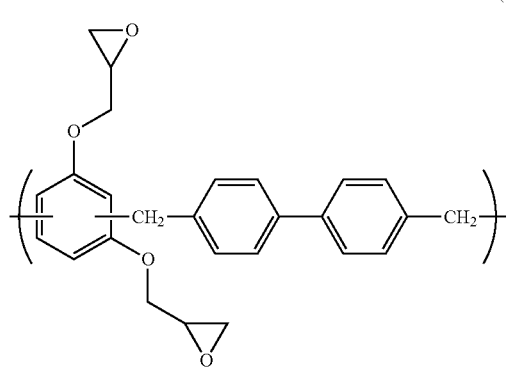
Formula (B-10)
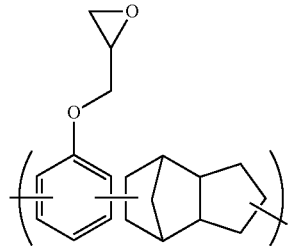
Formula (B-11)
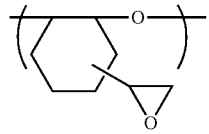
Formula (B-12)
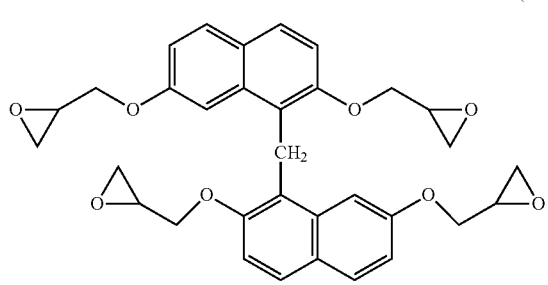
-continued
Formula (B-13)
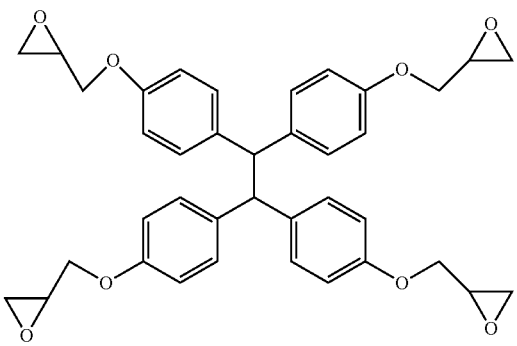
Formula (B-14)
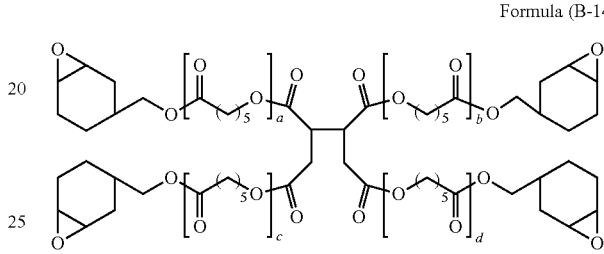
Formula (B-15)
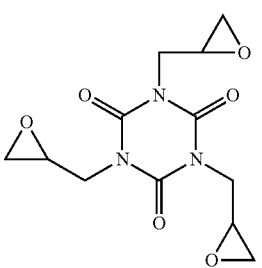
Formula (B-16)
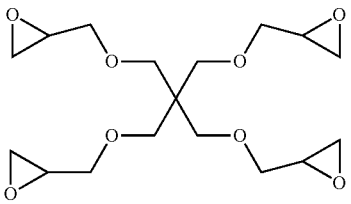
Formula (B-17)
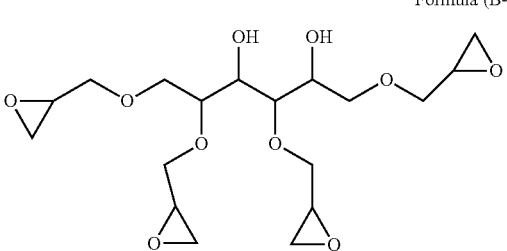
Formula (B-18)
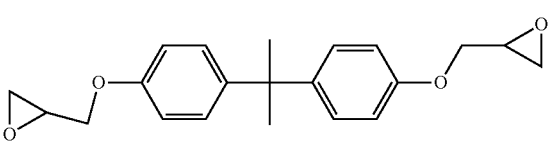

Formula (B-19)

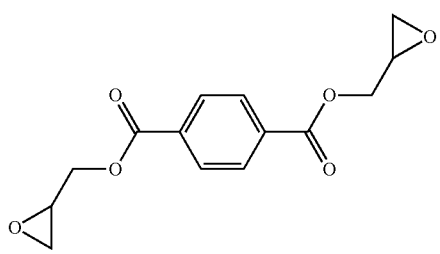

Formula (B-20)

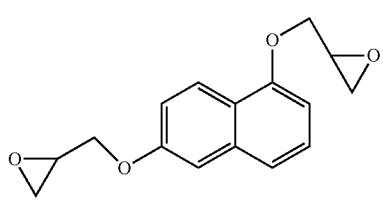

Formula (B-21)

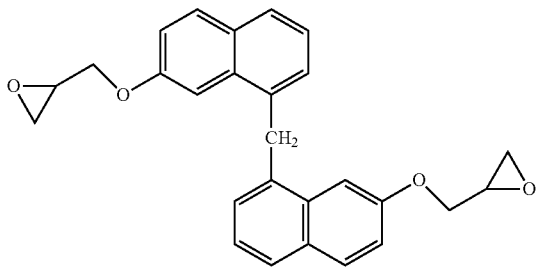

Formula (B-22)

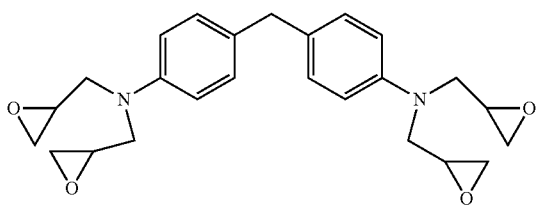

Formula (B-23)

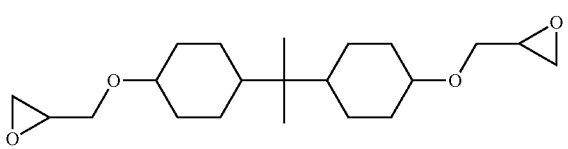

Formula (B-24)

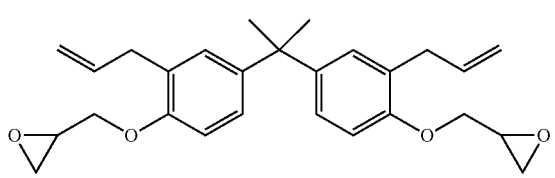

Formula (B-25)

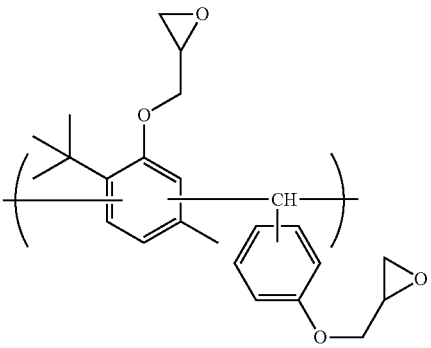

Formula (B-26)

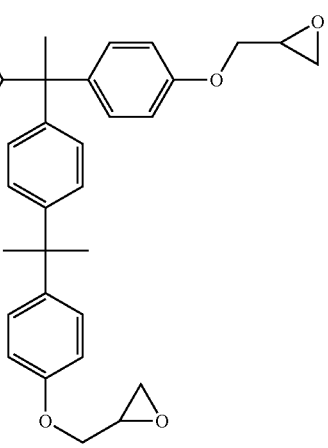

The compound of formula (B-1) is available as trade name EPICLON HP-5000 available from DIC Corporation.

The compound of formula (B-2) is available as trade name EPPN-501H available from NIPPON KAYAKU Co., Ltd.

The compound of formula (B-3) is available as trade name ECN-1229 available from Asahi Kasei Epoxy Co., Ltd.

The compound of formula (B-4) is available as trade name EPPN-501H available from NIPPON KAYAKU Co., Ltd.

The compound of formula (B-5) is available as trade name NC-2000L available from NIPPON KAYAKU Co., Ltd.

The compound of formula (B-6) is available as trade name NC-3000L available from NIPPON KAYAKU Co., Ltd.

The compound of formula (B-7) is available as trade name NC-7000L available from NIPPON KAYAKU Co., Ltd.

The compound of formula (B-8) is available as trade name NC-7300L available from NIPPON KAYAKU Co., Ltd.

The compound of formula (B-9) is available as trade name NC-3500 available from NIPPON KAYAKU Co., Ltd.

The compound of formula (B-10) is available as trade name HP-7200L available from DIC Corporation.

The compound of formula (B-11) is available as trade name EHPE-3150 available from Daicel Corporation.

The compound of formula (B-12) is available as trade name EPICLON HP-4700 available from DIC Corporation.

The compound of formula (B-13) is available as trade name TEP-G available from Asahi Organic Chemicals Industry Co., Ltd.

The compound of formula (B-14) is trade name EPO-LEAD GT401 available from Daicel Corporation. In formula (B-14), a, b, c, and d are each 0 or 1, and a+b+c+d is 1.

The compound of formula (B-15) is available as trade name TEPIC-SS available from Nissan Chemical Industries, Ltd.

The compound of formula (B-16) is available as trade name EX-411 available from Nagase ChemteX Corporation.

The compound of formula (B-17) is available as trade name EX-521 available from Nagase ChemteX Corporation.

The compound of formula (B-18) is available as trade name YH-434L available from NIPPON STEEL & SUMIKIN CHEMICAL CO., LTD.

The compound of formula (B-19) is available as trade name EX-711 available from Nagase ChemteX Corporation.

The compound of formula (B-20) is available as trade name YD-4032D available from DIC Corporation.

The compound of formula (B-21) is available as trade name HP-4770 available from DIC Corporation.

The compound of formula (B-22) is available as trade name YH-434L available from NIPPON STEEL & SUMIKIN CHEMICAL CO., LTD.

The compound of formula (B-23) can be available as a reagent.

The compound of formula (B-24) is available as trade name RE-810NM available from NIPPON KAYAKU Co., Ltd.

The compound of formula (B-25) is available as trade name FAE-2500 available from NIPPON KAYAKU Co., Ltd.

The compound of formula (B-26) is available as trade name NC-6000 available from NIPPON KAYAKU Co., Ltd.

Trade name EPICLON HP-6000 (epoxy value: 244 g/eq.) available from DIC Corporation may also be used.

The addition reaction of the carboxylic acid (carboxyl group)-containing compound, hydroxyl group-containing compound, amine (amino group)-containing compound, or thiol group-containing compound with the epoxy compound can be carried out in a solvent in the presence of a catalyst.

Examples of the catalyst include an amine and a salt thereof, an imidazole and a salt thereof, a phosphine and a salt thereof, a urea salt, and a sulfonium salt. For example, the following examples may be included.

Examples of the amine and an ammonium salt include an amine having a structure of formula (C-1) and a quaternary ammonium salt having a structure of formula (D-1):

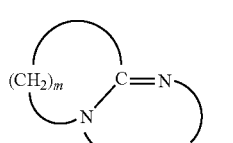

Formula (C-1)

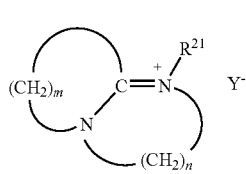

Formula (D-1)

(wherein m is an integer of 2 to 11, n is an integer of 2 to 3, $R^{21}$ is an alkyl group or an aryl group, and $Y^-$ is an anion), an amine having a structure of formula (C-2) and a quaternary ammonium salt having a structure of formula (D-2):

$$R^{22}R^{23}R^{24}N \qquad \text{Formula (C-2)}$$

$$R^{22}R^{23}R^{24}R^{25}N^+Y^- \qquad \text{Formula (D-2)}$$

(wherein $R^{22}$, $R^{23}$, $R^{24}$, and $R^{25}$ are an alkyl group or an aryl group, N is a nitrogen atom, $Y^-$ is an anion, and $R^{22}$, $R^{23}$, $R^{24}$, and $R^{25}$ are each bonded to a nitrogen atom through a C—N bond), an amine having a structure of formula (C-3) and a quaternary ammonium salt having a structure of formula (D-3):

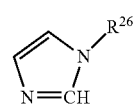

Formula (C-3)

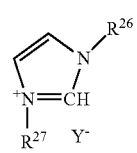

Formula (D-3)

(wherein $R^{26}$ and $R^{27}$ are an alkyl group or an aryl group, and Y– is an anion), a pyridine having a structure of formula (C-4) and a quaternary ammonium salt having a structure of formula (D-4):

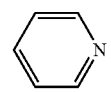

Formula (C-4)

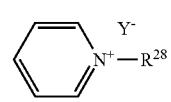

Formula (D-4)

(wherein $R^{28}$ is an alkyl group or an aryl group, and $Y^-$ is an anion), and a substituted pyridine having a structure of formula (C-5) and a quaternary ammonium salt having a structure of formula (D-5):

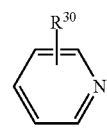

Formula (C-5)

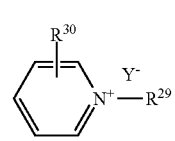

Formula (D-5)

(wherein $R^{29}$ and $R^{30}$ are an alkyl group or an aryl group, and $Y^-$ is an anion), and an amine having a structure of formula (C-6) and a tertiary ammonium salt having a structure of formula (D-6):

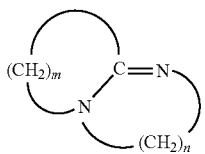

Formula (C-6)

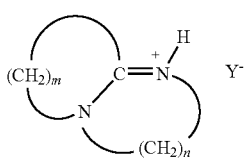

Formula (D-6)

(wherein m is an integer of 2 to 11, n is an integer of 2 to 3, H is a hydrogen atom, and Y⁻ is an anion).

Examples of the phosphine and a phosphonium salt include a phosphine of formula (C-7) and a quaternary phosphonium salt of formula (D-7):

$R^{31}R^{32}R^{33}P$   Formula (C-7)

$R^{31}R^{32}R^{33}R^{34}P^+Y^-$   Formula (D-7)

(wherein $R^{31}$, $R^{32}$, $R^{33}$, and $R^{34}$ are an alkyl group or an aryl group, P is a phosphorus atom, Y⁻ is an anion, and $R^{31}$, $R^{32}$, $R^{33}$, and $R^{34}$ are each bonded to a phosphorus atom through a C—P bond).

Examples of the sulfide and a sulfonium salt include a sulfide of formula (C-8) and a tertiary sulfonium salt of formula (D-8):

$R^{35}R^{36}S$   Formula (C-8)

$R^{35}R^{36}R^{37}S^+Y^-$   Formula (D-8)

(wherein $R^{35}$, $R^{36}$, and $R^{37}$ are an alkyl group or an aryl group, S is a sulfur atom, Y⁻ is an anion, and $R^{35}$, $R^{36}$, and $R^{37}$ are each bonded to a sulfur atom through a C—S bond).

The compound of formula (D-1) is a quaternary ammonium salt derived from an amine, m is an integer of 2 to 11, and n is an integer of 2 and 3. $R^{21}$ in the quaternary ammonium salt is a $C_{1-18}$ alkyl or aryl group, and preferably a $C_{2-10}$ alkyl or aryl group. Examples thereof include linear alkyl groups such as ethyl group, propyl group, and butyl group, benzyl group, cyclohexyl group, cyclohexylmethyl group, and dicyclopentadienyl group. Examples of the anion (Y⁻) include halogen ions such as a chloride ion (Cl⁻), a bromide ion (Br⁻), and an iodide ion (I⁻), and acid groups such as carboxylate (—COO⁻), sulfonate (—SO₃⁻), and alcoholate (—O⁻).

The compound of formula (D-2) is a quaternary ammonium salt of $R^{22}R^{23}R^{24}R^{25}N^+Y^-$. $R^{22}$, $R^{23}$, $R^{24}$, and $R^{25}$ in the quaternary ammonium salt are a $C_{1-18}$ alkyl or aryl group, or a silane compound having a silicon atom bonded through Si—C bond. Examples of the anion (Y⁻) include halogen ions such as a chloride ion (Cl⁻), a bromide ion (Br⁻), and an iodide ion (I⁻), and acid groups such as carboxylate (—COO⁻, sulfonate (—SO₃⁻), and alcoholate (—O⁻). The quaternary ammonium salt is available as a commercial product. Examples thereof include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of formula (D-3) is a quaternary ammonium salt derived from 1-substituted imidazole. The number of carbon atoms in $R^{26}$ and $R^{27}$ is 1 to 18, and the total number of carbon atoms in $R^{26}$ and $R^{27}$ is preferably 7 or more. Examples of $R^{26}$ include methyl group, ethyl group, propyl group, phenyl group, and benzyl group. Examples of $R^{27}$ include benzyl group, octyl group, and octadecyl group. Examples of the anion (Y⁻) include halogen ions such as a chloride ion (Cl⁻), a bromide ion (Br⁻), and an iodide ion (I⁻), and acid groups such as carboxylate (—COO⁻, sulfonate (—SO₃⁻), and alcoholate (—O⁻). This compound is available as a commercial product. For example, this compound can be produced by a reaction of an imidazole-based compound such as 1-methylimidazole and 1-benzylimidazole with an alkyl halide or an aryl halide such as benzyl bromide and methyl bromide.

The compound of formula (D-4) is a quaternary ammonium salt derived from pyridine. $R^{28}$ is a $C_{1-18}$ alkyl or aryl group, and preferably a $C_{4-18}$ alkyl or aryl group. Examples thereof include butyl group, octyl group, benzyl group, and lauryl group. Examples of the anion (Y⁻) include halogen ions such as a chloride ion (Cl⁻), a bromide ion (Br⁻), and an iodide ion (I⁻), and acid groups such as carboxylate (—COO⁻, sulfonate (—SO₃⁻), and alcoholate (—O⁻). This compound is available as a commercial product. For example, this compound can be produced by a reaction of a pyridine with an alkyl halide or an aryl halide such as lauryl chloride, benzyl chloride, benzyl bromide, methyl bromide, and octyl bromide. Examples of the compound include N-laurylpyridinium chloride and N-benzylpyridinium bromide.

The compound of formula (D-5) is a quaternary ammonium salt derived from substituted pyridine typified by picoline. $R^{29}$ is a $C_{1-18}$ alkyl or aryl group, and preferably a $C_{4-18}$ alkyl or aryl group. Examples thereof include methyl group, octyl group, lauryl group, and benzyl group. $R^{30}$ is a $C_{1-18}$ alkyl or aryl group. For example, when the compound is a quaternary ammonium derived from picoline, $R^{30}$ is a methyl group. Examples of the anion (Y⁻) include halogen ions such as a chloride ion (Cl⁻), a bromide ion (Br⁻), and an iodide ion (F), and acid groups such as carboxylate (sulfonate (—SO₃⁻), and alcoholate (—O⁻). This compound is available as a commercial product. For example, this compound can be produced by a reaction of substituted pyridine such as picoline with an alkyl halide or an aryl halide such as methyl bromide, octyl bromide, lauryl chloride, benzyl chloride, and benzyl bromide. Examples of the compound include N-benzylpicolinium chloride, N-benzylpicolinium bromide, and N-laurylpicolinium chloride.

The compound of formula (D-6) is a tertiary ammonium salt derived from an amine, m is an integer of 2 to 11, and n is an integer of 2 and 3. Examples of the anion (Y⁻) include halogen ions such as a chloride ion (Cl⁻), a bromide ion (Br⁻), and an iodide ion (I⁻), and acid groups such as carboxylate (—COO⁻), sulfonate (—SO₃⁻), and alcoholate (—O⁻). This compound can be produced by a reaction of an amine with a weak acid such as a carboxylic acid and phenol. Examples of the carboxylic acid include formic acid and acetic acid. In a case of using formic acid, the anion (Y⁻) is (HCOO⁻). In a case of using acetic acid, the anion (Y⁻) is (CH₃COO⁻). In a case of using phenol, the anion (Y⁻) is (C₆H₅O⁻).

The compound of formula (D-7) is a quaternary phosphonium salt of $R^{31}R^{32}R^{33}R^{34}P^+Y^-$. $R^{31}$, $R^{32}$, $R^{33}$, and $R^{34}$ are a $C_{1-18}$ alkyl or aryl group, or a silane compound having a silicon atom bonded through Si—C bond. It is preferable that three substituents of four substituents of $R^{31}$ to $R^{34}$ be phenyl groups or substituted phenyl groups such as a phenyl group and a tolyl group, and the rest be a $C_{1-18}$ alkyl or aryl group or a silane compound having a silicon atom bonded through a Si—C bond. Examples of the anion ($Y^-$) include halogen ions such as a chloride ion ($Cl^-$), a bromide ion ($Br^-$), and an iodide ion (E), and acid groups such as carboxylate (—$COO^-$), sulfonate (—$SO_3^-$), and alcoholate (—$O^-$). This compound is available as a commercial product. Examples thereof include tetraalkylphosphonium halides such as tetra-n-butylphosphonium halide and tetra-n-propylphosphonium halide, trialkylbenzylphosphonium halides such as triethylbenzylphosphonium halide, triphenylmonoalkylphosphonium halides such as triphenylmethylphosphonium halide and triphenylethylphosphonium halide, triphenylbenzylphosphonium halides, tetraphenylphosphonium halides, tritolylmonoarylphosphonium halides, or tritolylmonoalkylphosphonium halides (a halogen atom is a chlorine atom or a bromine atom). In particular, triphenylmonoalkylphosphonium halides such as triphenylmethylphosphonium halide and triphenylethylphosphonium halide, triphenylmonoarylphosphonium halides such as triphenylbenzylphosphonium halide, tritolylmonoarylphosphonium halides such as tritolylmonophenylphosphonium halide, and tritolylmonoalkylphosphonium halides such as tritolylmonomethylphosphonium halide (a halogen atom is a chlorine atom or a bromine atom) are preferable.

Examples of phosphines include primary phosphines such as methylphosphine, ethylphosphine, propylphosphine, isopropylphosphine, isobutylphosphine, and phenylphosphine, secondary phosphines such as dimethylphosphine, diethylphosphine, diisopropylphosphine, diisoamylphosphine, and diphenylphosphine, and tertiary phosphines such as trimethylphosphine, triethylphosphine, triphenylphosphine, methyldiphenylphosphine, and dimethylphenylphosphine.

The compound of formula (D-8) is a tertiary sulfonium salt of $R^{35}R^{36}R^{37}S^+Y^-$. $R^{35}$, $R^{36}$, and $R^{37}$ are a $C_{1-18}$ alkyl or aryl group, or a silane compound having a silicon atom bonded through Si—C bond. It is preferable that three substituents of four substituents of $R^{35}$ to $R^{37}$ be a phenyl group or a substituted phenyl group such as phenyl group and tolyl group, and the rest be a $C_{1-18}$ alkyl or aryl group. Examples of the anion ($Y^-$) include halogen ions such as a chloride ion ($Cl^-$), a bromide ion ($Br^-$), and an iodide ion ($I^-$), and acid groups such as carboxylate (—$COO^-$), sulfonate (—$SO_3^-$), alcoholate (—$O^-$), maleic acid anion, and nitric acid anion. This compound is available as a commercial product. Examples thereof include tetraalkylsulfonium halides such as tri-n-butylsulfonium halide and tri-n-propylsulfonium halide, trialkylbenzylsulfonium halides such as diethylbenzylsulfonium halide, diphenylmonoalkylsulfonium halides such as diphenylmethylsulfonium halide and diphenylethylsulfonium halide, triphenylsulfonium halide (a halogen atom is a chlorine atom or a bromine atom), tetraalkylphosphonium carboxylates such as tri-n-butylsulfonium carboxylate and tri-n-propylsulfonium carboxylate, trialkylbenzysulfonium carboxylates such as diethylbenzylsulfonium carboxylate, diphenylmonoalkylsulfonium carboxylates such as diphenylmethylsulfonium carboxylate and diphenylethylsulfonium carboxylate, and triphenylsulfonium carboxylate. Triphenylsulfonium halide or triphenylsulfonium carboxylate can be preferably used.

The amount of the catalyst used in synthesis of the compound used in the present invention is 0.01 to 10 parts by mass, 0.01 to 5 parts by mass, or 0.01 to 3 parts by mass, relative to 100 parts by mass of solid content of the epoxy compound.

Examples of the solvent used in the reaction include an alcohol-based solvent, an acetate-based solvent, cyclohexanone, N-methylpyrrolidone, and an amide-based solvent.

Examples of the compound used in the present invention include as follows.

Formula (1-1)

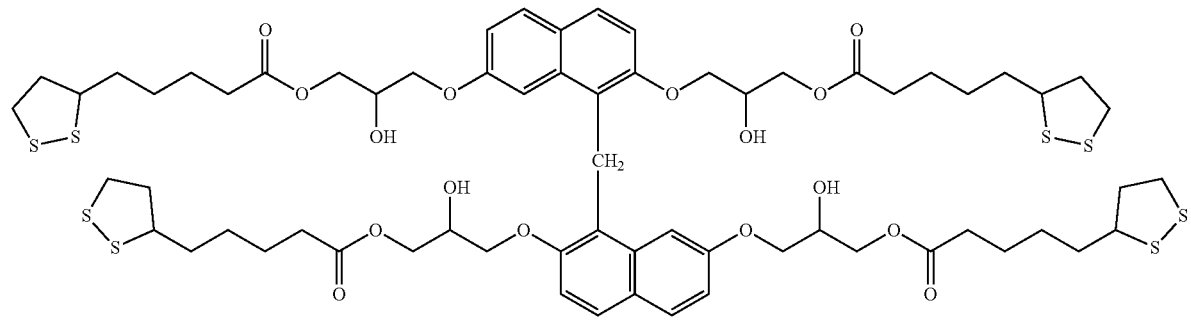

Formula (1-2)

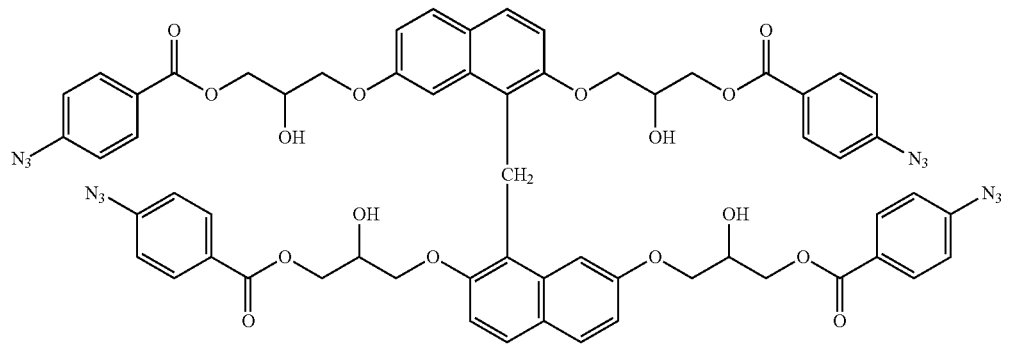

-continued

Formula (1-3)
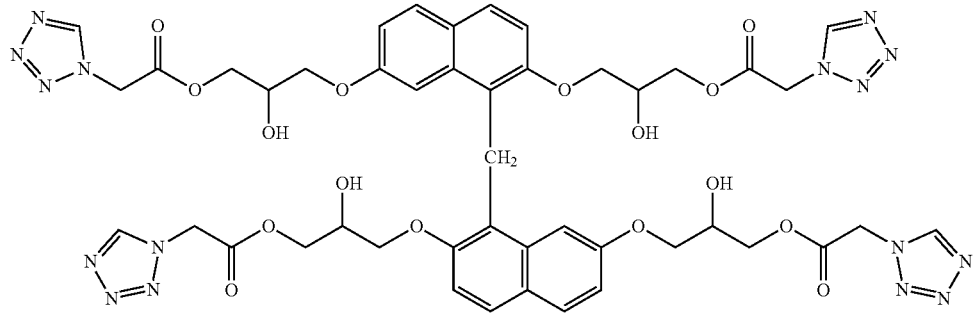

Formula (1-4)
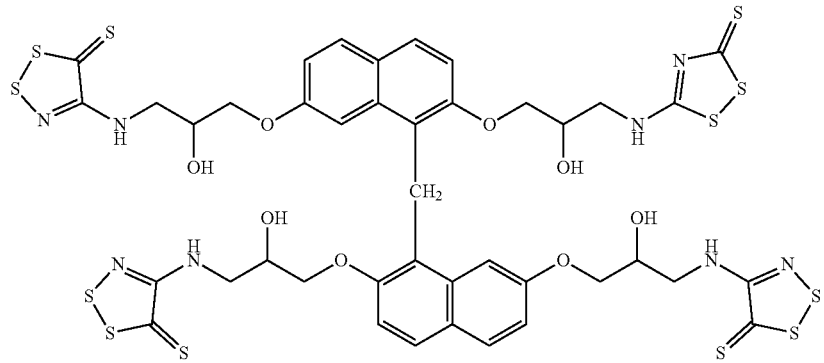

Formula (1-5)
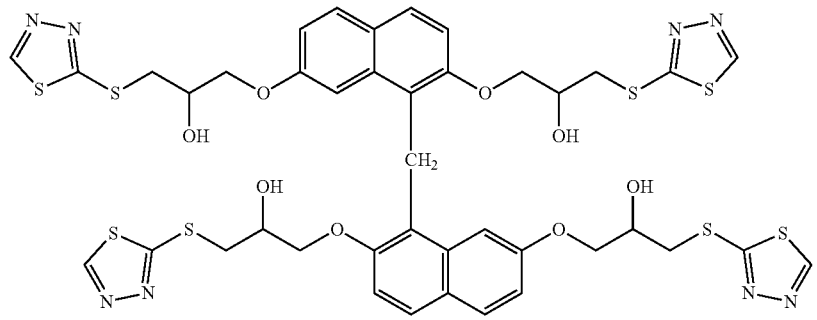

Formula (1-6)
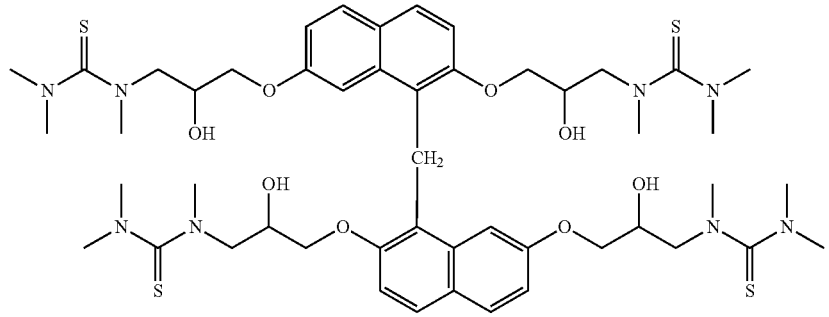

The photocurable composition of the present invention may contain a surfactant. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including Eftop [registered trademark] EF301, EF303, and EF352 (available from Mitsubishi Materials Electronic Chemicals Co., Ltd.), MEGAFACE [registered trademark] F171, F173, R30, R-30N, and R-40LM (available from DIC Corporation), Fluorad FC430 and FC431 (available from Sumitomo 3M, Ltd.), AsahiGuard [registered trademark] AG710, and Surflon [registered trademark] S-382, SC101, SC102, SC103, SC104, SC105, and SC106 (available from Asahi Glass Co., Ltd.), and organosiloxane polymer KP341 (available from Shin-Etsu Chemical Co., Ltd.). One type selected from the surfactants may be added, or two or more types thereof may be added in combination. The content of the surfactant is, for example, 0.01% by mass to 5% by mass relative to the solid content of the photocurable composition of the present invention except for a solvent described below.

As a solvent capable of dissolving the compound used in the present invention, ethylene glycol monomethyl ether, ethylene glycol monoethyl ether, ethylene glycol monobutyl ether, ethylene glycol monoisopropyl ether, ethylene glycol methyl ether acetate, ethylene glycol ethyl ether acetate, methyl cellosolve acetate, ethyl cellosolve acetate, diethylene glycol, diethylene glycol monomethyl ether, diethylene glycol monoethyl ether, diethylene glycol dimethyl ether, diethylene glycol diethyl ether, diethylene glycol monoethyl ether acetate, propylene glycol, propylene glycol monomethyl ether, propylene glycol monobutyl ether, propylene glycol monomethyl ether acetate, propylene glycol monoethyl ether, propylene glycol monoethyl ether acetate, propylene glycol propyl ether acetate, dipropylene glycol monomethyl ether, dipropylene glycol monoethyl ether, triethylene glycol dimethyl ether, toluene, xylene, styrene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, propylene glycol, benzyl alcohol, 1,3-butanediol, 1,4-butanediol, 2,3-butanediol, γ-butyrolactone, acetone, methyl isopropyl ketone, diethyl ketone, methyl isobutyl ketone, methyl n-butyl ketone, isopropyl acetate ketone, n-propyl acetate, isobutyl acetate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-octanol, ethylene glycol, hexylene glycol, trimethylene glycol, 1-methoxy-2-butanol, diacetone alcohol, furfuryl alcohol, tetrahydrofurfuryl alcohol, propylene glycol, benzyl alcohol, isopropyl ether, 1,4-dioxane, N,N-dimethyl paternmuamide, N,N-dimethylacetamide, N-methylpyrrolidone, 1,3-dimethyl-2-imidazolidinone, dimethylsulfoxide, or N-cyclohexyl-2-pyrrolidone may be used. These organic solvents are used alone, or two or more types thereof are used in combination.

Next, a method for forming a flattened film using the photocurable composition of the present invention as a stepped substrate-coating composition will be described. The stepped substrate-coating composition is applied to a substrate used in production of a precision integrated circuit element (e.g., a transparent substrate such as a silicon/silicon dioxide coating, a glass substrate, and an ITO substrate) by an appropriate coating method using a spinner or a coater, baked (heated), and exposed to light to form a coating film. Specifically, a coated substrate is produced by a step (i) of applying the stepped substrate-coating composition to a stepped substrate, and a step (ii) of exposing the composition to light.

When a spinner is used for coating, for example, the coating can be carried out at a revolution speed of 100 to 5,000 for 10 to 180 seconds.

As the substrate, a substrate having an open area (unpatterned area) and a patterned area of dense (DENCE) and coarse (ISO) patterns of which the aspect ratio is 0.1 to 10 can be used.

The unpatterned area is a portion having no pattern (e.g., a hole or trench structure) on the substrate. The dense (DENCE) pattern is a portion of the substrate that is dense with patterns, and the coarse (ISO) pattern is a portion of the substrate where a distance between the patterns is long and the patterns are scattered. The aspect ratio of the patterns is a ratio of the depth of the pattern to the width of the pattern. The pattern depth is usually several hundred nanometers (e.g., about 100 to 300 nm). The dense (DENCE) pattern is a portion where the patterns of several ten nanometers (e.g., 30 to 80 nm) are densely disposed at intervals of about 100 nm. The coarse (ISO) pattern is a portion where the patterns of several hundred nanometers (e.g., about 200 to 1,000 nm) are scattered.

Herein, the thickness of the stepped substrate-coating film (flattened film) is preferably 0.01 to 3.0 µm. After the step (i), the applied composition can be heated in a step (ia). The condition includes at 70 to 400° C. or 100 to 250° C. for 10 seconds to 5 minutes or 30 seconds to 2 minutes. By heating, the stepped substrate-coating composition reflows to form a flat stepped substrate-coating film (flattened film).

The exposure light in the step (ii) is actinic radiation such as near ultraviolet light, far ultraviolet light, or extreme ultraviolet light (e.g., EUV with a wavelength of 13.5 nm). For example, light having a wavelength of 248 nm (KrF laser beam), 193 nm (ArF laser beam), 172 nm (xenon excimer beam), or 157 nm ($F_2$ laser beam) can be used. Further, ultraviolet light having an exposure wavelength of 150 nm to 248 nm may be used, and ultraviolet light having a wavelength of 172 nm may be preferably used.

By the exposure to light, crosslinking of the stepped substrate-coating film (flattened film) is carried out. The exposure dose of exposure light in the step (ii) may be 10 mJ/cm$^2$ to 3,000 mJ/cm$^2$. Under exposure to light at an exposure dose falling within this range, a photoreaction is caused to form crosslinking between the compounds. As a result, solvent resistance is imparted to a flattened film to be obtained.

In the stepped substrate-coating film (flattened film) thus formed, it is desirable that the difference in level of coating (Bias) between the open area and the patterned area be 0. The stepped substrate-coating film can be flattened so that the Bias falls within a range of 1 to 50 nm or 1 to 25 nm. The Bias between the open area and the area of DENCE pattern is about 15 to 20 nm, and the Bias between the open area and the area of ISO pattern is about 1 to 10 nm.

The stepped substrate-coating film (flattened film) obtained by the present invention is coated with a resist film, the resist film is exposed to light by lithography, and developed to form a resist pattern. The stepped substrate-coating film (flattened film) and the substrate can be processed through the resist pattern. In this case, the stepped substrate-coating film (flattened film) is a resist underlayer film, and the stepped substrate-coating composition is a resist underlayer film-forming composition.

A resist is applied to the resist underlayer film, irradiated with light or an electron beam through a predetermined mask, developed, rinsed, and dried. Thus, a favorable resist pattern can be obtained. If necessary, post exposure bake (PEB) can also be carried out after irradiation with light or an electron beam. The resist underlayer film at a portion where the resist is developed and removed in the aforementioned step can be removed by dry etching, to form a desired pattern on the substrate.

The exposure light for the photoresist is actinic radiation such as near ultraviolet light, far ultraviolet light, or extreme ultraviolet light (e.g., EUV with a wavelength of 13.5 nm). For example, light having a wavelength of 248 nm (KrF laser beam), 193 nm (ArF laser beam), or 157 nm ($F_2$ laser beam) can be used. In irradiation with light, any method can be adopted without particular restriction as long as it is a method capable of generating an acid from a photoacid generator in the resist. The exposure dose is 1 to 3,000 mJ/cm$^2$, 10 to 3,000 mJ/cm$^2$, or 10 to 1000 mJ/cm$^2$.

In irradiation of an electron beam resist with an electron beam, for example, an electron beam irradiation apparatus can be used.

As a developer for a resist having a resist underlayer film formed from a resist underlayer film-forming material for lithography (photocurable composition) in the present invention, an aqueous solution of alkali including an inorganic alkali such as sodium hydroxide, potassium hydroxide, sodium carbonate, sodium silicate, sodium methasilicate, and ammonia water, a primary amine such as ethylamine and n-propylamine, a secondary amine such as diethylamine and di-n-butylamine, a tertiary amine such as triethylamine and methyldiethylamine, an alcoholamine such as dimethylethanolamine and triethanolamine, a quaternary ammonium salt such as tetramethylammonium hydroxide, tetraethylammonium hydroxide, or choline, and a cyclic amine such as pyrrole and piperidine can be used. Proper amounts of an alcohol such as isopropyl alcohol and a surfactant such as a nonionic surfactant may be added to the aqueous solution of the alkali to be used. Among the developers, an alkali used in a preferable developer is a quaternary ammonium salt, and more preferably tetramethylammonium hydroxide or choline.

As the developer, an organic solvent may be used. Examples of the organic solvent include methyl acetate, butyl acetate, ethyl acetate, isopropyl acetate, amyl acetate, isoamyl acetate, ethyl methoxyacetate, ethyl ethoxyacetate, propylene glycol monomethyl ether, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. Further, a surfactant or the like can be also added to the developer. A development condition is appropriately selected from a temperature of 5° C. to 50° C. and a time of 10 to 600 seconds.

In the present invention, a semiconductor device can be produced through steps of forming a resist underlayer film on a semiconductor substrate from the resist underlayer film-forming composition (photocurable composition), forming a resist film on the resist underlayer film, irradiating the resist film with light or an electron beam, followed by development to form a resist pattern, etching the resist underlayer film through the resist pattern, and processing the semiconductor substrate through the patterned resist underlayer film.

As formation of finer resist pattern further proceeds, problems arise such as resolution and collapse of resist pattern after development. Therefore, a decrease in film thickness of resist is desired. In this case, it is difficult to obtain a resist pattern film thickness sufficient for substrate processing. A process for imparting a function of a mask during substrate processing to not only the resist pattern but also the resist underlayer film that is formed between the resist and the semiconductor substrate to be processed is required. As a resist underlayer film for such a process, unlike a conventional resist underlayer film having a high etching rate, a resist underlayer film for lithography having a selection ratio of dry etching rate close to that of the resist, a resist underlayer film for lithography having a smaller selection ratio of dry etching rate than that of the resist, and a resist underlayer film for lithography having a smaller selection ratio of dry etching rate than that of the semiconductor substrate are required. In response to the request, from the resist underlayer film-forming composition (photocurable composition) of the present invention, the resist underlayer film for such a process can be formed. Further, an anti-reflective performance may be imparted to such a resist underlayer film, and the resist underlayer film may have a function of a conventional anti-reflective coating.

In order to obtain a finer resist pattern, a process for making the resist pattern and the resist underlayer film finer than the pattern width during resist development by dry etching of the resist underlayer film is used. Unlike the conventional anti-reflective coating having a high etching rate, the resist underlayer film having a selection ratio of dry etching close to that of the resist, is required as the resist underlayer film for such a process. In response to the request, from the resist underlayer film-forming composition (photocurable composition) of the present invention, the resist underlayer film for such a process can be formed. An anti-reflective performance may be imparted to such a resist underlayer film, and the resist underlayer film may have the function of the conventional anti-reflective coating.

In the present invention, the resist underlayer film of the present invention is formed on the substrate, and the resist may be applied directly to the resist underlayer film, or if necessary, the resist may be applied after one or more layers of coating material are formed on the resist underlayer film. In this case, even when the resist is thinly applied to prevent pattern collapse due to a decrease in pattern width of the resist, the substrate can be processed by selection of appropriate etching gas.

Specifically, a semiconductor device can be produced through steps of forming a resist underlayer film on a semiconductor substrate from the resist underlayer film-forming composition, forming a hard mask from a coating material containing a silicon component or the like or forming a hard mask (e.g., silicon nitride oxide) by vapor deposition on the resist underlayer film, forming a resist film on the hard mask, irradiating the resist film with light or an electron beam, followed by development to form a resist pattern, etching the hard mask through the resist pattern by halogen-based gas, etching the resist underlayer film through the patterned hard mask by an oxygen-based gas or hydrogen-based gas, and processing the semiconductor substrate through the patterned resist underlayer film by a halogen-based gas.

The resist underlayer film obtained from the resist underlayer film-forming composition for lithography (photocurable composition) of the present invention has a light absorption moiety in the skeleton, in consideration of effects of the anti-reflective coating. Therefore, a substance is not diffused in a photoresist during heating and drying, and the light absorption moiety has sufficiently high light absorption performance. Accordingly, the resist underlayer film has a high anti-reflective effect.

The resist underlayer film obtained from the resist underlayer film-forming composition for lithography (photocurable composition) of the present invention has high thermal stability, and can prevent pollution of a top layer due to a decomposed substance during baking, and impart a margin of temperature in a baking step.

Further, the resist underlayer film obtained from the resist underlayer film-forming material for lithography (photocurable composition) of the present invention can be used, depending on a process condition, as a film having a function of preventing reflection of light and a function of preventing an interaction between a substrate and a photoresist or an adverse influence on the substrate from a material used for the photoresist or a substance produced during exposure of the photoresist to light.

EXAMPLES

Synthesis Example 1

In a two-neck flask, 3.00 g of epoxy group-containing benzene condensed ring compound (trade name: EPICLON HP-4700, epoxy value: 165 g/eq, available from DIC Corporation), 3.82 g of DL-α-lipoic acid (available from Tokyo Chemical Industry Co., Ltd.), 0.17 g of ethyltriphenylphosphonium bromide (available from HOKKO CHEMICAL INDUSTRY CO., LTD.), and 0.01 g of hydroquinone (available from Tokyo Chemical Industry Co., Ltd.) were placed, and 16.34 g of cyclohexanone was added. The mixture was heated and stirred at 100° C. for 20.5 hours in a nitrogen atmosphere. To the obtained solution, 7.0 g of cation exchange resin (trade name: DOWEX [registered trademark] 550A, Muromachi Technos Co., Ltd.) and 7.0 g of anion exchange resin (trade name: AMBERLITE [registered trademark] 15JWET, ORGANO CORPORATION) were added, and the mixture was subjected to an ion exchange treatment at room temperature for 4 hours. The ion-exchange resins were separated, and a solution of compound (formula (1-1)) was obtained. The weight average molecular weight Mw measured by GPC in terms of polystyrene was 3,800.

Synthesis Example 2

In a two-neck flask, 4.00 g of epoxy group-containing benzene condensed ring compound (trade name: EPICLON HP-4700, epoxy value: 165 g/eq, available from DIC Corporation), 4.03 g of 4-azidebenzoic acid (available from Tokyo Chemical Industry Co., Ltd.), 0.23 g of ethyltriphenylphosphonium bromide (available from HOKKO CHEMICAL INDUSTRY CO., LTD.), and 0.01 g of hydroquinone (available from Tokyo Chemical Industry Co., Ltd.) were placed, and 19.30 g of propylene glycol monomethyl ether was added. The mixture was heated and stirred at 100° C. for 17.5 hours in a nitrogen atmosphere. To the obtained solution, 8.27 g of cation exchange resin (trade name: DOWEX [registered trademark] 550A, Muromachi Technos Co., Ltd.) and 8.27 g of anion exchange resin (trade name: AMBERLITE [registered trademark] 15JWET, ORGANO CORPORATION) were added, and the mixture was subjected to an ion exchange treatment at room temperature for 4 hours. The ion-exchange resins were separated, and a solution of compound (formula (1-2)) was obtained. The weight average molecular weight Mw measured by GPC in terms of polystyrene was 1,400.

Synthesis Example 3

In a two-neck flask, 4.00 g of epoxy group-containing benzene condensed ring compound (trade name: EPICLON HP-4700, epoxy value: 165 g/eq, available from DIC Corporation), 3.16 g of 1H-tetrazole-1-acetic acid (available from Tokyo Chemical Industry Co., Ltd.), 0.23 g of ethyltriphenylphosphonium bromide (available from HOKKO CHEMICAL INDUSTRY CO., LTD.), and 0.01 g of hydroquinone (available from Tokyo Chemical Industry Co., Ltd.) were placed, and 17.28 g of propylene glycol monomethyl ether was added. The mixture was heated and stirred at 100° C. for 18 hours in a nitrogen atmosphere. To the obtained solution, 7.41 g of cation exchange resin (trade name: DOWEX [registered trademark] 550A, Muromachi Technos Co., Ltd.) and 7.41 g of anion exchange resin (trade name: AMBERLITE [registered trademark] 15JWET, ORGANO CORPORATION) were added, and the mixture was subjected to an ion exchange treatment at room temperature for 4 hours. The ion-exchange resins were separated, and a solution of compound (formula (1-3)) was obtained. The weight average molecular weight Mw measured by GPC in terms of polystyrene was 1,200.

Synthesis Example 4

In a two-neck flask, 4.00 g of epoxy group-containing benzene condensed ring compound (trade name: EPICLON HP-4700, epoxy value: 165 g/eq, available from DIC Corporation), 3.71 g of xanthane hydride (available from Tokyo Chemical Industry Co., Ltd.), 0.23 g of ethyltriphenylphosphonium bromide (available from HOKKO CHEMICAL INDUSTRY CO., LTD.), and 0.01 g of hydroquinone (available from Tokyo Chemical Industry Co., Ltd.) were placed, and 18.56 g of cyclohexanone was added. The mixture was heated and stirred at 80° C. for 11 hours in a nitrogen atmosphere. To the obtained solution, 7.95 g of cation exchange resin (trade name: DOWEX [registered trademark] 550A, Muromachi Technos Co., Ltd.) and 7.95 g of anion exchange resin (trade name: AMBERLITE [registered trademark] 15JWET, ORGANO CORPORATION) were added, and the mixture was subjected to an ion exchange treatment at room temperature for 4 hours. The ion-exchange resins were separated, and a solution of compound (1-4) was obtained. The weight average molecular weight Mw measured by GPC in terms of polystyrene was 3,100.

Synthesis Example 5

In a two-neck flask, 5.00 g of epoxy group-containing benzene condensed ring compound (trade name: EPICLON HP-4700, epoxy value: 165 g/eq, available from DIC Corporation), 3.61 g of 1,3,4-thiadiazol-2-thiol (available from Tokyo Chemical Industry Co., Ltd.), 0.29 g of ethyltriphenylphosphonium bromide (available from HOKKO CHEMICAL INDUSTRY CO., LTD.), and 0.02 g of hydroquinone (available from Tokyo Chemical Industry Co., Ltd.) were placed, and 20.89 g of cyclohexanone was added. The mixture was heated and stirred at 60° C. for 24 hours in a nitrogen atmosphere. To the obtained solution, 8.95 g of cation exchange resin (trade name: DOWEX [registered trademark] 550A, Muromachi Technos Co., Ltd.) and 8.95 g of anion exchange resin (trade name: AMBERLITE [registered trademark] 15JWET, ORGANO CORPORATION) were added, and the mixture was subjected to an ion exchange treatment at room temperature for 4 hours. The ion-exchange resins were separated, and a solution of compound (1-5) was obtained. The weight average molecular weight Mw measured by GPC in terms of polystyrene was 1,070.

Synthesis Example 6

In a two-neck flask, 4.5 g of epoxy group-containing benzene condensed ring compound (trade name: EPICLON HP-4700, epoxy value: 165 g/eq, available from DIC Corporation), 3.29 g of trimethylthiourea (available from Wako Pure Chemical Industries, Ltd.), 0.29 g of ethyltriphenylphosphonium bromide (available from HOKKO CHEMICAL INDUSTRY CO., LTD.), and 18.20 g of cyclohexanone were placed. The mixture was heated and stirred at 60° C. for 24 hours in a nitrogen atmosphere. To the obtained solution, 7.80 g of cation exchange resin (trade name: DOWEX [registered trademark] 550A, Muromachi Technos Co., Ltd.) and 7.80 g of anion exchange resin (trade name: AMBERLITE [registered trademark] 15JWET, ORGANO CORPORATION) were added, and the mixture was subjected to an ion exchange treatment at room temperature for 4 hours. The ion-exchange resins were separated, and a solution of compound (1-6) was obtained. The weight average molecular weight Mw measured by GPC in terms of polystyrene was 1,360.

Example 1

To 4.00 g of the resin solution (solid content: 25.60% by mass) obtained in Synthesis Example 1, 0.002 g of surfactant (trade name: MEGAFACE [product name] R-40 available from DIC Corporation, fluorosurfactant), 0.977 g of propylene glycol monomethyl ether acetate, and 7.64 g of cyclohexanone were added to prepare a solution of resist underlayer film-forming composition.

Example 2

To 6.00 g of the resin solution (solid content: 23.92% by mass) obtained in Synthesis Example 2, 0.001 g of surfactant (trade name: MEGAFACE [product name] R-40 available from DIC Corporation, fluorosurfactant), 7.00 g of propylene glycol monomethyl ether, and 4.81 g of propylene glycol monomethyl ether acetate were added to prepare a solution of resist underlayer film-forming composition.

Example 3

To 4.00 g of the resin solution (solid content: 23.17% by mass) obtained in Synthesis Example 3, 0.001 g of surfactant (trade name: MEGAFACE [product name] R-40 available from DIC Corporation, fluorosurfactant), 0.128 g of propylene glycol monomethyl ether, 0.442 g of propylene glycol monomethyl ether acetate, and 6.94 g of cyclohexanone were added to prepare a solution of resist underlayer film-forming composition.

Example 4

To 4.10 g of the resin solution (solid content: 23.30% by mass) obtained in Synthesis Example 4, 0.002 g of surfactant (trade name: MEGAFACE [product name] R-40 available from DIC Corporation, fluorosurfactant), 0.912 g of propylene glycol monomethyl ether acetate, and 6.76 g of cyclohexanone were added to prepare a solution of resist underlayer film-forming composition.

Example 5

To 4.50 g of the resin solution (solid content: 21.51% by mass) obtained in Synthesis Example 5, 0.002 g of surfactant (trade name: MEGAFACE [product name] R-40 available from DIC Corporation, fluorosurfactant), 0.924 g of propylene glycol monomethyl ether acetate, and 6.51 g of cyclohexanone were added to prepare a solution of resist underlayer film-forming composition.

Example 6

To 7.00 g of the resin solution (solid content: 13.66% by mass) obtained in Synthesis Example 6, 0.002 g of surfactant (trade name: MEGAFACE [product name] R-40 available from DIC Corporation, fluorosurfactant), 0.913 g of propylene glycol monomethyl ether acetate, and 3.87 g of cyclohexanone were added to prepare a solution of resist underlayer film-forming composition.

(Photocuring Test)

Each of the resist underlayer film-forming compositions prepared in Examples 1 to 6 was applied (spin coating) to a silicon wafer using a spinner. The compositions were each heated on a hot plate at 100° C. or 215° C. for one minute to form a coating film (resist underlayer film) having a thickness of 210 to 270 nm. The resist underlayer film was irradiated with ultraviolet light of 500 mJ/cm$^2$ by an ultraviolet irradiation apparatus using a UV irradiation unit (wavelength: 172 nm) equipped with ACT-12 manufactured by Tokyo Electron Ltd. The solvent separation under irradiation with light (irradiation with ultraviolet light) was confirmed. For the solvent separation, the coated film after irradiation with ultraviolet light was immersed in a mixed solvent of propylene glycol monomethyl ether and propylene glycol monomethyl ether acetate at a ratio of 7:3 for one minute, spin-dried, and baked at 100° C. for one minute, and the film thickness was measured.

TABLE 1

Evaluation of photocuring properties of resist underlayer film

| | Baking temperature (° C.) | Initial film thickness (Å) | Film thickness after irradiation with light (Å) | Film thickness after solution separation (Å) |
|---|---|---|---|---|
| Example 1 | 215 | 2225 | 2219 | 2210 |
| Example 2 | 100 | 2655 | 2591 | 2579 |
| Example 3 | 215 | 2239 | 2178 | 2153 |
| Example 4 | 100 | 2399 | 2389 | 2368 |
| Example 5 | 215 | 2153 | 2100 | 2083 |
| Example 6 | 215 | 2191 | 2221 | 2196 |

(Measurement of Optical Constant)

The solutions of the resist underlayer film-forming compositions prepared in Examples 1 to 6 were each applied to a silicon wafer using a spin coater. The compositions were each baked on a hot plate at 215° C. for one minute or at 100° C. for one minute to form a resist underlayer film (thickness: 0.05 μm). The refractive index (n value) and the light absorption coefficient (k value, also referred to as extinction coefficient) of the resist underlayer films were measured at a wavelength of 193 nm and 248 nm using a spectroscopic ellipsometer. The results are shown in Table 2.

TABLE 2

Refractive index n and light absorption coefficient k

|  |  | n/k 193 nm | n/k 248 nm |
|---|---|---|---|
| Example 1 | Film baked at 215° C. | 1.70/0.11 | 1.94/0.35 |
| Example 2 | Film baked at 100° C. | 1.52/0.34 | 1.86/0.43 |
| Example 3 | Film baked at 215° C. | 1.58/0.14 | 1.99/0.44 |
| Example 4 | Film baked at 100° C. | 1.66/0.23 | 1.98/0.47 |
| Example 5 | Film baked at 215° C. | 1.70/0.20 | 1.97/0.54 |
| Example 6 | Film baked at 215° C. | 1.56/0.19 | 2.12/0.72 |

(Measurement of Dry Etching Rate)

As an etcher and an etching gas used in measurement of dry etching rate, the following etcher and gas were used.

RIE-10NR (manufactured by SAMCO INC.): $CF_4$

The solutions of the resist underlayer film-forming compositions prepared in Examples 1 to 6 were each applied to a silicon wafer using a spin coater. The compositions were each baked on a hot plate at 215° C. for one minute or at 100° C. for one minute to form a resist underlayer film (thickness: 0.20 μm). The dry etching rate of each of the resist underlayer films was measured using a $CF_4$ gas as an etching gas. The dry etching rates of the resist underlayer films in Examples 1 to 6 were compared with the dry etching rate of KrF photoresist. The results are shown in Table 3. The dry etching rate ratio is a ratio of the dry etching rate of the resist underlayer film to the dry etching rate of the KrF photoresist.

TABLE 3

Dry etching rate ratio

| Example 1 | Rate ratio of film baked at 215° C. | 1.25 |
|---|---|---|
| Example 2 | Rate ratio of film baked at 100° C. | 1.26 |
| Example 3 | Rate ratio of film baked at 215° C. | 1.48 |
| Example 4 | Rate ratio of film baked at 100° C. | 1.37 |
| Example 5 | Rate ratio of film baked at 215° C. | 1.52 |
| Example 6 | Rate ratio of film baked at 215° C. | 1.10 |

(Flattening Test on Stepped Substrate)

For evaluation of step-coating properties, the coating film thicknesses at a densely patterned area (D-1) with a trench width of 50 nm and a pitch of 100 nm, an open area (OPEN) without patterns, and a large trench area with a trench width of 230 nm (T-1) and 800 nm (T-2) of a $SiO_2$ substrate with a thickness of 200 nm were compared. The resist underlayer films prepared in Examples 1 to 6 were each applied on the substrate so as to have a thickness of 150 nm, baked at 215° C. for one minute or at 100° C. for 60 seconds, and irradiated with ultraviolet light of 500 $mJ/cm^2$ by an ultraviolet irradiation apparatus using a UV irradiation unit (wavelength: 172 nm) manufactured by USHIO INC. Flattening was observed by a scanning electron microscope (S-4800) manufactured by Hitachi High-Technologies Corporation. Differences between the film thickness at the open area and that at the densely patterned area and differences between the film thickness at the open area and that at the large trench area were measured, and flattening was evaluated. The measured film thickness differences are shown in Table 4.

TABLE 4

Evaluation of step-coating properties

| Sample | Film thickness difference (nm) D-1/Open | Film thickness difference (nm) T-1/Open | Film thickness difference (nm) T-2/Open |
|---|---|---|---|
| Example 1 | 22 | 0 | 14 |
| Example 2 | Unmeasurable (separation) | Unmeasurable (separation) | Unmeasurable (separation) |
| Example 3 | 20 | 0 | 2 |
| Example 4 | 29 | 3 | 20 |
| Example 5 | 10 | 4 | 2 |
| Example 6 | 64 | 38 | 55 |

INDUSTRIAL APPLICABILITY

The resist underlayer film-forming composition can be used as a photocurable composition that has high pattern filling properties, and that is capable of forming a coating film that does not cause heat shrinkage and forming a coating film to be flattened on the substrate.

The invention claimed is:

1. A photocurable composition comprising
at least one compound having a structure including at least one structure selected from the group consisting of a photodegradable nitrogen-containing structure, a photodegradable sulfur-containing structure, and a combination thereof,
wherein the photodegradable nitrogen-containing structure is a photodegradable nitrogen-containing structure optionally having a sulfur atom, the photodegradable nitrogen-containing structure including a tetrazole structure, a triazole structure, an imidazole structure, an azole structure, a diazo structure, or a combination of these photodegradable nitrogen-containing structures,
wherein the photodegradable sulfur-containing structure is a photodegradable sulfur-containing structure optionally having a nitrogen atom, the photodegradable sulfur-containing structure including a trisulfide structure, a disulfide structure, a thioketone structure, a thiophene structure, a thiol structure, or a combination of these photodegradable sulfur-containing structures, the photocurable composition also including a hydrocarbon structure, wherein the hydrocarbon structure is in the structure of the at least one compound or is in a separate compound included in the photocurable composition, and a solvent, wherein the at least one compound is a compound obtained by an addition reaction of a carboxylic acid (carboxyl-group)-containing compound, a hydroxyl group-containing compound, an amine (amino-group)-containing compound, or a thiol group-containing compound with an epoxy compound.

2. The photocurable composition according to claim 1, wherein the at least one compound is a compound having the combination of the photodegradable nitrogen-containing structure and the photodegradable sulfur-containing structure in the structure of one molecule of the at least one compound.

3. The photocurable composition according to claim 1, wherein the at least one compound is a compound having the combination of the photodegradable nitrogen-containing structure and the photodegradable sulfur-containing structure, and the hydrocarbon structure, in the structure of one molecule of the at least one compound.

4. The photocurable composition according to claim 1, wherein the hydrocarbon structure is a saturated or unsaturated, linear, branched, or cyclic hydrocarbon group having a carbon atom number of 1 to 40.

5. The photocurable composition according to claim 1, wherein a content of the at least one compound is 30 to 100% by mass relative to the mass of solid content of the photocurable composition.

6. A method for producing a coated substrate comprising steps of:
    (i) applying the photocurable composition according to claim 1 to a substrate; and
    (ii) exposing the applied photocurable composition to light.

7. The method according to claim 6, comprising, after the step (i), a step (ia) of heating the applied photocurable composition at 70 to 400° C. for 10 seconds to 5 minutes.

8. The method according to claim 6, wherein the exposure light in the step (ii) has a wavelength of 150 nm to 248 nm.

9. The method according to claim 6, wherein an exposure dose of the exposure light in the step (ii) is 10 $mJ/cm^2$ to 3,000 $mJ/cm^2$.

10. The method according to claim 6, wherein the semiconductor substrate has an open area (unpatterned area) and a patterned area of dense (DENCE) and crude (ISO) patterns, and an aspect ratio of the patterns is 0.1 to 10.

11. A method for producing a semiconductor device comprising steps of:
    applying the photocurable composition according to claim 1 to a semiconductor substrate, followed by exposure to light, to form an underlayer film;
    forming a resist film on the underlayer film;
    irradiating the resist film with light or an electron beam, followed by development, to form a resist pattern;
    etching the underlayer film through the resist pattern; and
    processing the semiconductor substrate through the patterned underlayer film.

12. A method for producing a semiconductor device comprising steps of:
    applying the photocurable composition according to claim 1 to a semiconductor substrate, followed by exposure to light, to form an underlayer film;
    forming a hard mask on the underlayer film;
    forming a resist film on the hard mask;
    irradiating the resist film with light or an electron beam, followed by development, to form a resist pattern;
    etching the hard mask through the resist pattern;
    etching the underlayer film through the patterned hard mask; and
    processing the semiconductor substrate through the patterned underlayer film.

* * * * *